(12) United States Patent
Peng et al.

(10) Patent No.: US 9,690,338 B2
(45) Date of Patent: Jun. 27, 2017

(54) ELECTRONIC DEVICE WITH COOLING FACILITY

(71) Applicant: ScienBizip Consulting (Shen Zhen) Co., Ltd., Shenzhen (CN)

(72) Inventors: Wen-Tang Peng, New Taipei (TW); Xiao-Zheng Li, Shenzhen (CN)

(73) Assignee: ScienBiziP Consulting(Shenzhen)Co., Ltd., Shenzhen (CN)

( * ) Notice: Subject to any disclaimer, the term of this patent is extended or adjusted under 35 U.S.C. 154(b) by 29 days.

(21) Appl. No.: 14/793,995

(22) Filed: Jul. 8, 2015

(65) Prior Publication Data

US 2016/0231791 A1 Aug. 11, 2016

(30) Foreign Application Priority Data

Feb. 10, 2015 (CN) .......................... 2015 1 0068115

(51) Int. Cl.
*G06F 1/20* (2006.01)
*H05K 7/20* (2006.01)

(52) U.S. Cl.
CPC ........... *G06F 1/20* (2013.01); *H05K 7/20727* (2013.01)

(58) Field of Classification Search
CPC .............................. G06F 1/20; H05K 7/20145
See application file for complete search history.

(56) References Cited

U.S. PATENT DOCUMENTS

| 5,168,424 | A | * | 12/1992 | Bolton | G06F 1/20 165/122 |
| 6,172,870 | B1 | * | 1/2001 | Novotny | G06F 1/187 361/679.37 |
| 9,451,733 | B2 | * | 9/2016 | Dunn | H05K 7/20972 |
| 2004/0145881 | A1 | * | 7/2004 | Kosugi | F04D 29/601 361/810 |
| 2004/0252456 | A1 | * | 12/2004 | Larson | G06F 1/20 361/694 |
| 2006/0121421 | A1 | * | 6/2006 | Spitaels | G06F 1/206 434/118 |
| 2009/0249700 | A1 | * | 10/2009 | Peterson | A45F 3/08 52/2.17 |
| 2011/0273841 | A1 | * | 11/2011 | Paquin | H05K 7/20727 361/679.48 |
| 2012/0026686 | A1 | * | 2/2012 | Suzuki | F24F 11/0001 361/689 |
| 2012/0069514 | A1 | * | 3/2012 | Ross | H05K 7/20727 361/679.33 |
| 2012/0140406 | A1 | * | 6/2012 | Kliewer | H05K 7/20727 361/679.48 |
| 2014/0063721 | A1 | * | 3/2014 | Herman | G06F 1/20 361/679.31 |

(Continued)

*Primary Examiner* — Courtney Smith
*Assistant Examiner* — Keith Depew
(74) *Attorney, Agent, or Firm* — Steven Reiss

(57) ABSTRACT

An electronic device includes a housing defining a number of vents. A suction member is mounted in the housing and includes a hollow air guiding tube defining a plurality of air holes for a plurality of air shields to selectively shield or unshield each air hole. Two fans are disposed at opposite ends of the air guiding tube and aligned with the plurality of vents of a side plate. A number of electronic components which require cooling are mounted and located at each side of the suction member and the air shields can be removed or left in place as required to collect heat which is generated.

15 Claims, 5 Drawing Sheets

(56) References Cited

U.S. PATENT DOCUMENTS

| | | | |
|---|---|---|---|
| 2015/0072606 A1* | 3/2015 | Mundt | G06F 1/20 454/184 |
| 2016/0044827 A1* | 2/2016 | Proctor | H05K 7/20436 361/692 |
| 2016/0128237 A1* | 5/2016 | Szeremeta | G11B 33/128 361/679.31 |

* cited by examiner

ELECTRONIC DEVICE WITH COOLING FACILITY

FIELD

The subject matter herein generally relates to cooling technology.

BACKGROUND

Electronic devices, such as servers or computers, can be permanently on. The electronic devices can comprise motherboards, storage devices, and the like. During operation, a lot of heat is generated by the motherboards and the storage devices and needs to be dissipated.

BRIEF DESCRIPTION OF THE DRAWINGS

Implementations of the present technology will now be described, by way of example only, with reference to the attached figures.

DETAILED DESCRIPTION

Figure 1:
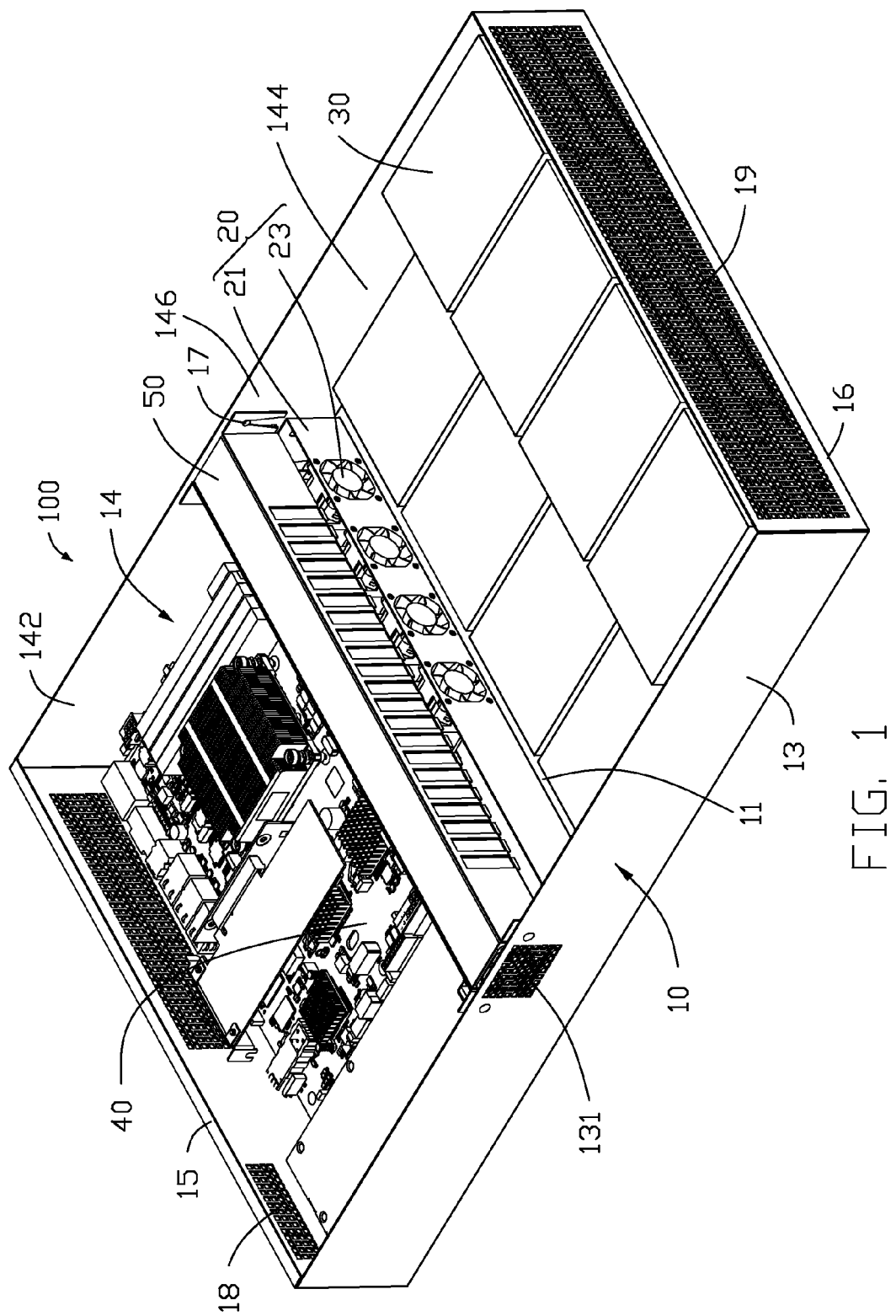
FIG. 1 is an assembled, isometric view of a first embodiment of an electronic device with suction member.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

The present disclosure describes an electronic device with adaptable cooling facility.

FIG. 1 illustrates an embodiment of an electronic device 100 which comprises a housing 10, a cooling module 20, a plurality of hard disk drives (HDDs) 30, a mother board 40, and a suction member 50. In at least one embodiment, the electronic device 100 is a server.

The housing 10 comprises a bottom plate 11, two side plates 13 perpendicularly extending upward from opposite sides of the bottom plate 11, a front plate 15 perpendicularly extending upward from a front end of the bottom plate 11, and a rear plate 16 perpendicularly extending upward from a rear end of the bottom plate 11 and coupled between the two side plates 13. The bottom plate 11, the two side plates 13, the front plate 15, and the rear plate 16 cooperatively define a housing interior 14. The housing interior 14 comprises a front portion 142 near the front plate 15, a rear portion 144 near the rear plate 16, and a coupling portion 146 coupled between the front portion 142 and the rear portion 144. A plurality of vents 131 is defined in each side plate 13 for communicating with the coupling portion 146 of the housing interior 14. Two posts 17 extend inward from each side plate 13, located at opposite sides of the plurality of vents 131 of the side plate 13. The front plate 15 defines a plurality of air inlets 18 communicating with the front portion 142 of the housing interior 14. The rear plate 16 defines a plurality of air outlets 19 communicating with the rear portion 144 of the housing interior 14.

Figure 2:
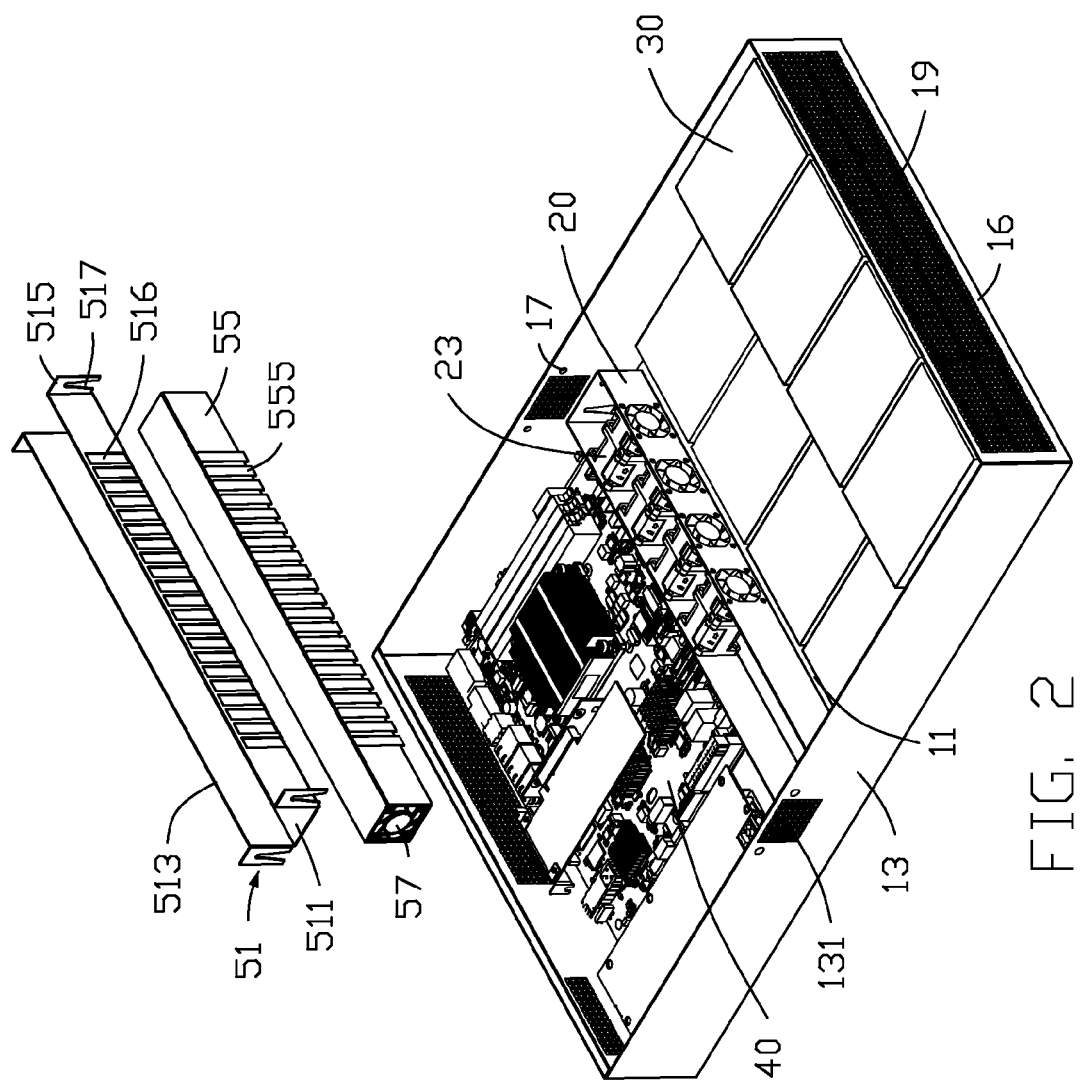
FIG. 2 is an exploded, isometric view of the electronic device of FIG. 1.

FIGS. 1 and 2 illustrate that the cooling module 20 comprises a frame 21 received in the coupling portion 146 and supported by the bottom plate 11. The frame 21 is attached between the two side plates 13 and a plurality of fans 23 is mounted in the frame 21. The frame 21 defines a plurality of vents arranged in a row in a direction parallel to the front plate 15. The plurality of fans 23 is mounted between the plurality of vents.

A plurality of electronic components is arranged on the mother board 40. In at least one embodiment, the plurality of electronic components can be CPU, memory, and other components.

Figure 3:
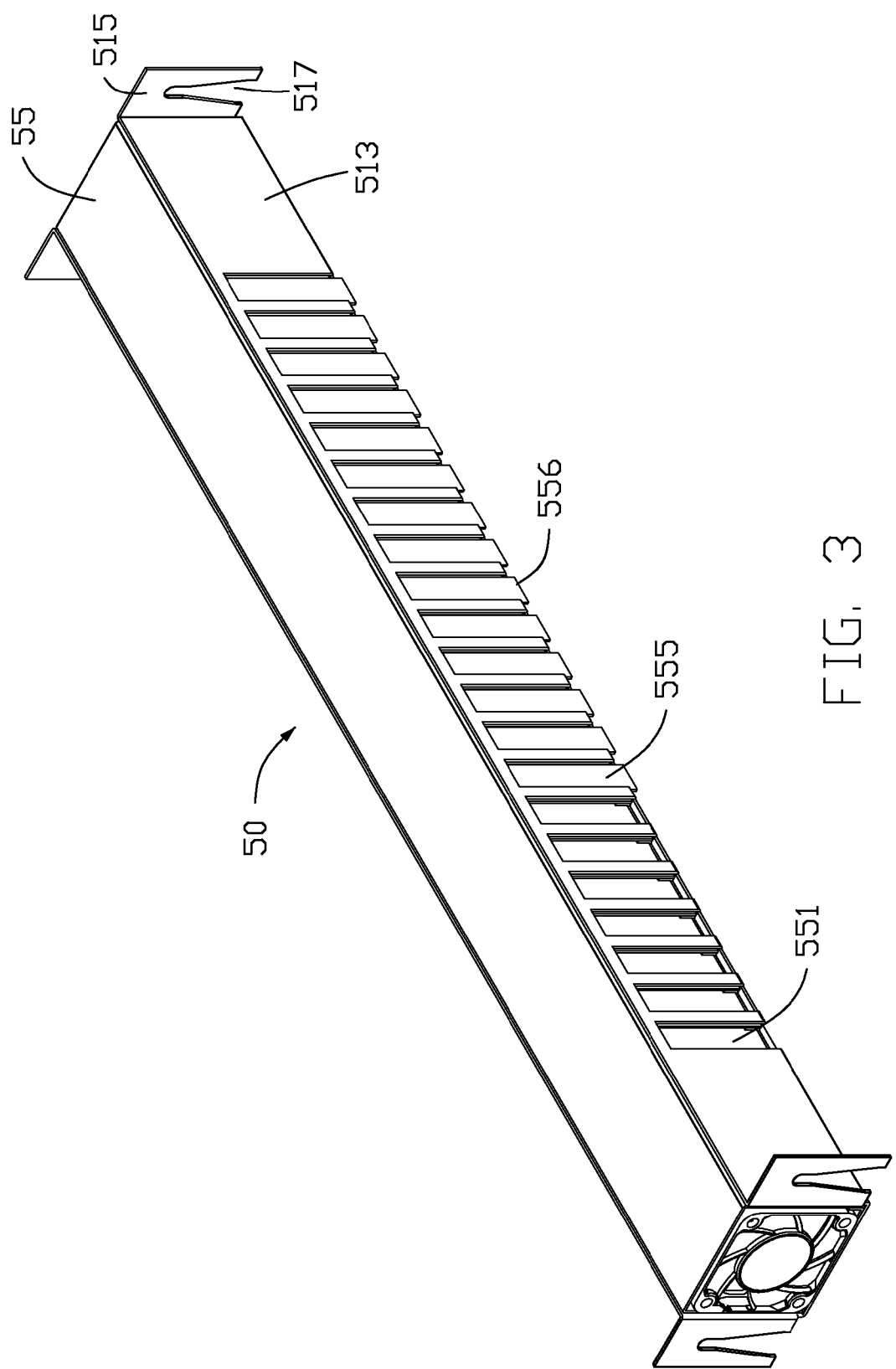
FIG. 3 is an isometric view of a suction member of the electronic device of FIG. 1.
Figure 5:
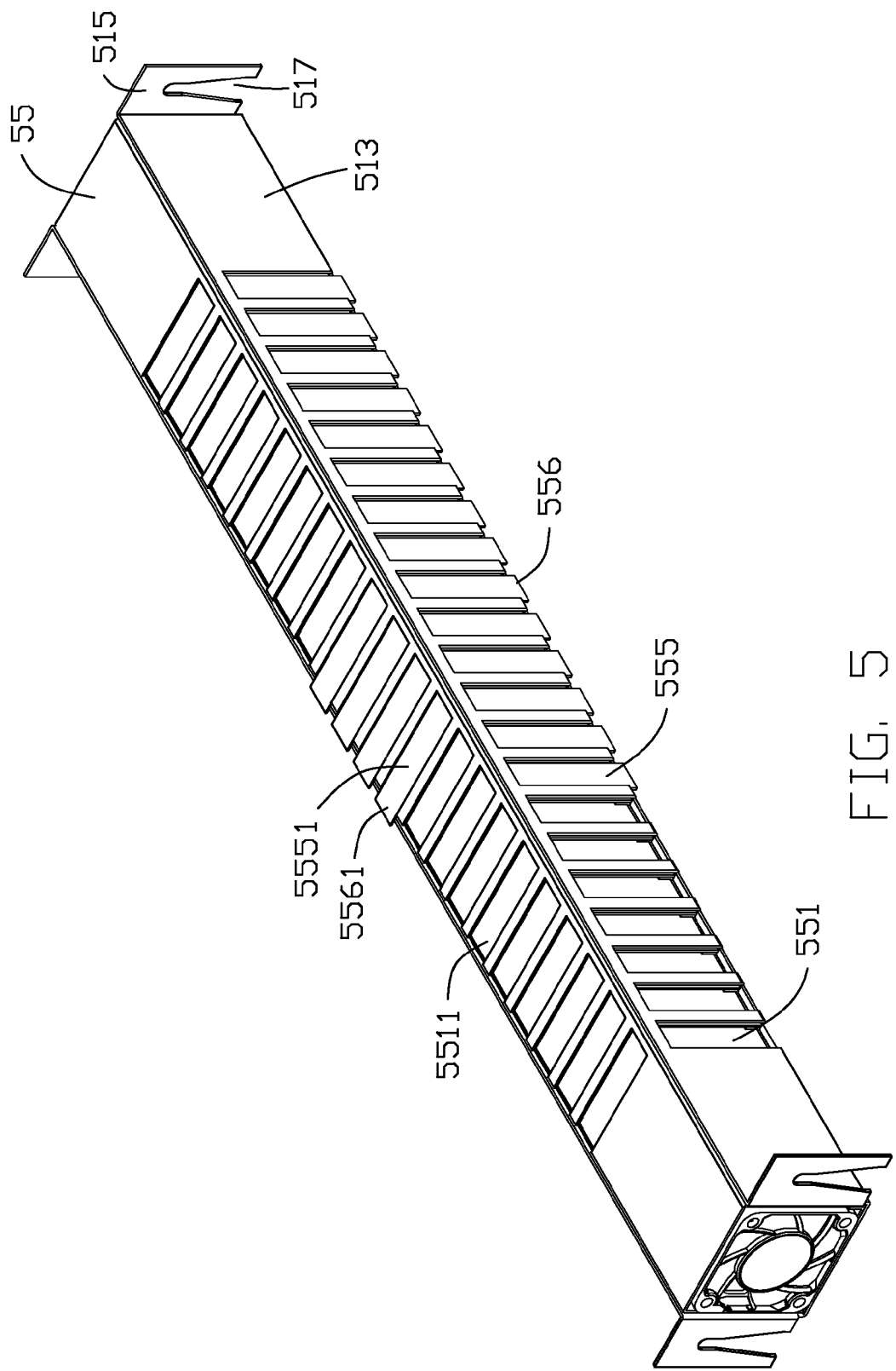
FIG. 5 is a second embodiment of the suction member of FIG. 3.

FIGS. 2 and 3 illustrate that the suction member 50 comprises a bracket 51, an air guiding tube 55 defining a cavity through opposite ends thereof, and two fans 57 disposed at opposite ends of the air guiding tube 55. The bracket 51 comprises a rectangular bottom board 511, two side boards 513 perpendicularly extending upward from opposite sides of the bottom board 511, and two extension tabs 515 perpendicularly extending outward from opposite ends of each side board 513. One of the two side boards 513 defines a plurality of through holes 516 arranged in a row in a direction parallel to the front plate 15. An inverted V-shaped slot 517 is defined in a bottom portion of each extension tab 515. A first side wall of the air guiding tube 55 defines a plurality of air holes 551 arranged in a row in a direction parallel to the front plate 15, corresponding to the plurality of through holes 516. The air guiding tube 55 comprises a plurality of air shields 555 configured to be selectively tore down to prevent from shielding the plurality of air holes 551. In at least one embodiment, the air guiding tube 55 is made of mylar. The plurality of air shields 555 is integrally formed with the air guiding tube 55. A plurality of operating portions 556 extends from surrounding edges of each air shield 555 to allow the easy removal of the air shield 555. In at least one embodiment, the suction member 50 does not have the bracket 51, and the opposite ends of the air guiding tube 55 are attached to the two side plates 13. In at least one embodiment, FIG. 5 illustrates that the suction member 50 has a plurality of air holes 5511 defined in a top wall of the air guiding tube 55. The air guiding tube 55 further comprises a plurality of air shields 5551 configured to be selectively tore down to prevent from shielding the plurality of air holes 5511. A plurality of operating portions 5561 extends from surrounding edges of each air shield 5551 to allow the easy removal of the air shield 5551.

FIGS. 1-3 illustrate assembly of the electronic device 100. The air guiding tube 55 is arranged between the two side boards 513 of the bracket 51 and configured to align the plurality of air shields 555 of the air guiding tube 55 with the plurality of through holes 516 of the bracket 51. To mount the suction member 50, the bracket 51 is arranged over the housing 10 to align the bottom board 511 of the bracket 51 with the frame 21 of the cooling module 20 and to align the slots 517 of the bracket 51 with the posts 17 of the housing 10. The bracket 51 is slowly lowered to engage the posts 17 in top portions of the slots 517. Each fan 57 is aligned with the plurality of vents 131 of a corresponding side plate 13. The plurality of HDDs 30 is mounted in the front portion 142 and the mother board 40 is mounted in the rear portion 144. A cover plate (not shown) covers the top of the housing 10. The air guiding tube 55 in the bracket 51 abuts against and is held stable by the cover plate.

Figure 4:
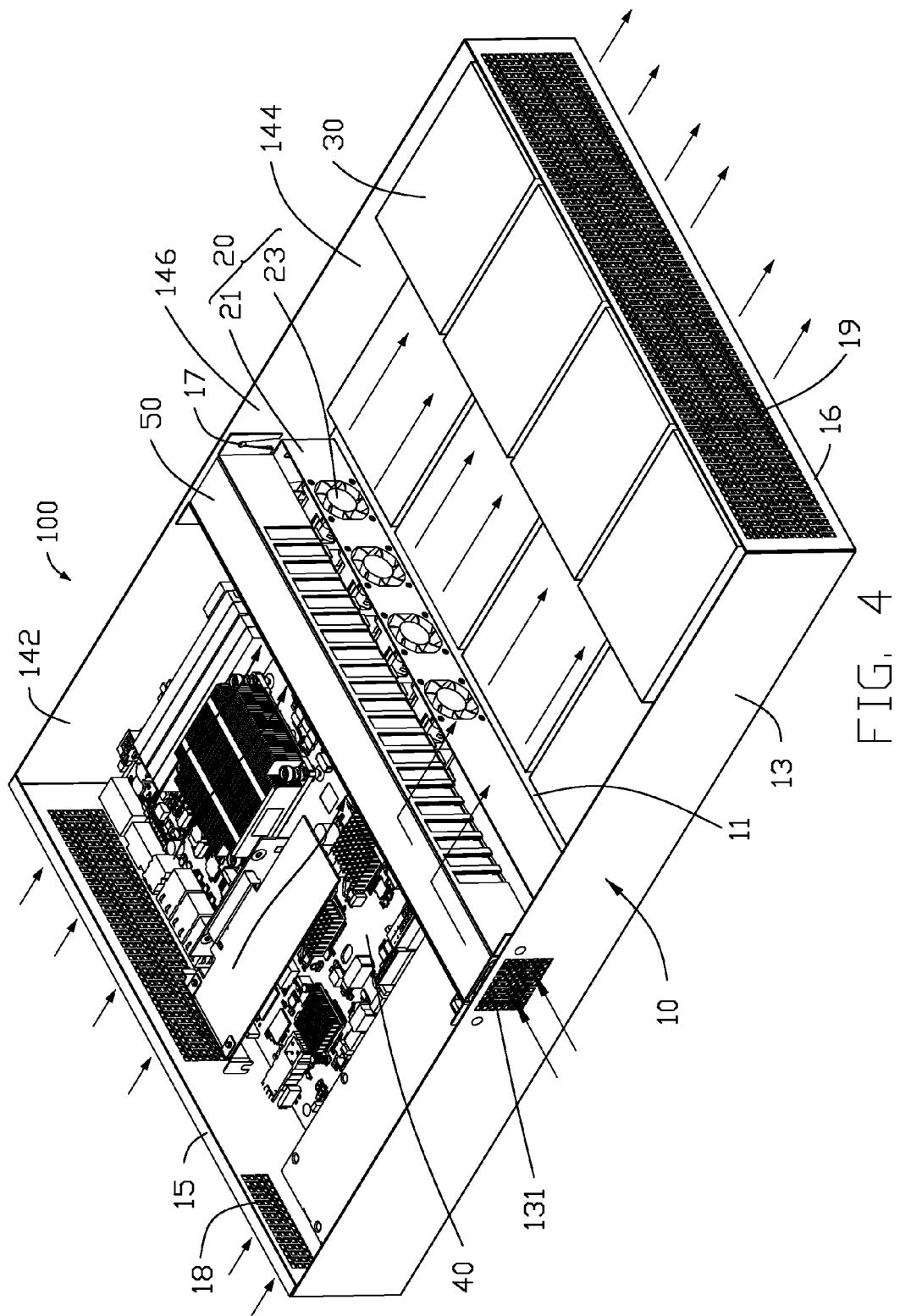
FIG. 4 is similar to FIG. 1, wherein the electronic device is in use.

FIG. 4 illustrates the electronic device 100 in use. A portion of the plurality of air shields 555 is tore down, to make a portion of the plurality of air holes 551 shielded by the portion of the plurality of air shields 555 communicate with a portion of the plurality of through holes 516. The plurality of fans 23 is operated to drive first cool air to flow into the front portion 142 of the housing interior 14 through the plurality of air inlets 18 of the front plate 15. The first cool air flows through and over the mother board 40. Then, the first cool air flows through the plurality of fans 23. After that, the first cool air flows through and over the plurality of HDDs 30, and is exhausted out of the rear portion 144 of the housing interior 14 through the plurality of air outlets 19 of the rear plate 16. The two fans 57 are operated to drive second cool air to flow into the air guiding tube 55 through the plurality of vents 131 of one of the two side plates 13. A portion of the second cool air flows into the rear portion 144 of the housing interior 14 and through the portion of the plurality of air holes 551 which are opened and the portion of the plurality of through holes 516. The portion of the second cool air flows through the plurality of HDDs 30 for heat dissipation, and is exhausted out of the rear portion 144 of the housing interior 14 through the plurality of air outlets 19 of the rear plate 16. In at least one embodiment, the suction member 50 can be disposed under the cooling module 20, with the plurality of vents 131 of each side plate 13 near the bottom plate 11. The plurality of air shields 555 can be slidably coupled to the air guiding tube 55 to selectively shield or unshield the plurality of air holes 551.

The embodiments shown and described above are only examples. Many details are often found in the art such as the other features of an electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An electronic device comprising: a housing comprising two opposite side plates each defining a plurality of vents; a motherboard mounted in the housing; a plurality of hard disk drives (HDDs) mounted in the housing, and a suction member moveably mounted in the housing, and the suction member comprising a bracket moveably mounted between the two side plates; wherein the plurality of HDDs are located at one side of the suction member, and the motherboard is located at another opposite side of the suction member; wherein the suction member comprises an air guiding tube and two fans, the air guiding tube is hollow and defines a plurality of air holes, the air guiding tube comprises a plurality of air shields, and the plurality of air shields is selectively shielded on the plurality of air holes, the bracket is configured to receive the air guiding tube, and the two fans are disposed at opposite ends of the air guiding tube and aligned with the plurality of vents of the two side plates.

2. The electronic device of claim 1, wherein the air guiding tube comprises a plurality of walls, the plurality of air holes is defined in any one of the plurality of walls.

3. The electronic device of claim 1, wherein the bracket comprises opposite side boards, and the air guiding tube is arranged between the two side boards.

4. The electronic device of claim 3, wherein the side board near the HDDs defines a plurality of through holes aligned with the plurality of air holes.

5. The electronic device of claim 1, wherein the bracket further comprises two extension tabs, a slot is defined in each extension tab, and two posts are located on each side plate and are movably received in corresponding two slots.

6. The electronic device of claim 5, wherein each slot is inverted V-shaped.

7. The electronic device of claim 1, further comprising a cooling module mounted in the housing and located at a side of the suction member.

8. The electronic device of claim 7, wherein the cooling module is disposed under the suction member.

9. The electronic device of claim 7, wherein the cooling module comprises a frame mounted in the housing and a plurality of fans mounted in the frame.

10. The electronic device of claim 1, wherein the air guiding tube is made of Mylar.

11. An electronic device comprising: a housing comprising a bottom plate, two side plates located on the bottom plate, and a front plate and a rear plate both coupled between the two side plates; wherein the bottom plate, the two side plates, the front plate, and the rear plate define a housing interior, the housing interior comprises a front portion near the front plate, a rear portion near the rear plate, and a coupling portion coupled between the front portion and the rear portion, each side plate defines a plurality of vents communicating with the coupling portion; a motherboard mounted in the front portion; a plurality of hard disk drives (HDDs) mounted in the rear portion; and a suction member mounted in the coupling portion, and the suction member comprising a bracket moveably mounted between the two side plates; wherein the suction member comprises an air guiding tube and two fans, the air guiding tube is hollow and defines a plurality of air holes communicating with the rear portion, the air guiding tube comprises a plurality of air shields, and the plurality of air shields is selectively shielded on the plurality of air holes, the bracket is configured to receive the air guiding tube, the two fans are disposed at opposite ends of the air guiding tube and aligned with the plurality of vents of the two side plates; wherein the motherboard and the plurality of HDDs define a first air passage for a first cool air flowing through, and the plurality of HDDs and the suction member with the plurality of air holes define a second air passage for a second cool air flowing through.

12. The electronic device of claim 11, wherein the air guiding tube comprises a plurality of walls, the plurality of air holes is defined in any one of the plurality of walls.

13. The electronic device of claim 11, wherein the bracket comprises two extension tabs, a slot is defined in each extension tab, and two posts are located on each side plate and are movably received in corresponding two slots.

14. The electronic device of claim 13, wherein each slot is inverted V-shaped.

15. The electronic device of claim 11, further comprising a cooling module mounted in the housing and located at a side of the suction member.

\* \* \* \* \*